United States Patent [19]

Buist

[11] Patent Number: 4,859,250
[45] Date of Patent: Aug. 22, 1989

[54] THERMOELECTRIC PILLOW AND BLANKET

[76] Inventor: Richard J. Buist, 1802 Clover Trail, Richardson, Tex. 75081

[21] Appl. No.: 91,323

[22] Filed: Aug. 31, 1987

Related U.S. Application Data

[63] Continuation of Ser. No. 784,189, Oct. 4, 1985, abandoned.

[51] Int. Cl.$^4$ .............. H01L 35/28; A47C 21/04; H05B 1/00; F25B 21/02
[52] U.S. Cl. ............ 136/225; 126/205; 219/212; 5/482; 5/490; 5/421; 5/434; 136/230; 62/3.3
[58] Field of Search .............. 5/421, 434, 436, 482, 5/495; 237/77; 2/1; 219/211, 212, 217; 62/3; 54/79; 136/224–227, 230, 236.1; 126/204, 205; 310/306; 322/2 R; 128/82.1, 399, 402, 403, 362, 379; D6/601

[56] References Cited

U.S. PATENT DOCUMENTS

| | | | |
|---|---|---|---|
| D. 282,515 | 2/1986 | Wada et al. | D6/601 |
| 2,844,638 | 7/1958 | Lindenblad | 136/212 |
| 3,090,206 | 5/1963 | Anders | 136/225 |
| 3,269,875 | 8/1966 | White | 136/212 |
| 3,305,393 | 2/1967 | Breckenridge | 136/225 |
| 3,648,469 | 3/1972 | Chapman | 5/434 |
| 3,879,229 | 4/1975 | Gilbert | 136/225 |
| 4,111,717 | 9/1978 | Baxter | 136/225 |
| 4,276,441 | 6/1981 | Wilson | 136/225 |
| 4,325,151 | 4/1982 | Wu | 5/421 |

*Primary Examiner*—Barry S. Richman
*Assistant Examiner*—T. J. Wallen

[57] ABSTRACT

A thermoelectric heat pump or power source device is provided with P-type and N-type elements made of either thin films or thick films for use on flexible or nonflexible substrates. For flexible units the film type elements are formed on substrates of such flexible, electrically insulation material as, for example, MYLAR and TEFLON; while for inflexible units the elements are formed on substrates of such materials as, for example, Beryllia, Alumina, ceramics, or plastics. Further, the elements are patterned on the different substrates for particular usages. For example, radial element patterns are used for cooling hot spots and ladder element patterns are used for cooling linear hot bodies. Ladder element patterns may also be used on flexible substrates to be folded to form corrugations having cold strips and hot strips on opposing sides to which sheets of suitable material can be attached to form panels, blankets, therapeutic devices or pipe coverings for heating or cooling their contents as desired.

2 Claims, 5 Drawing Sheets

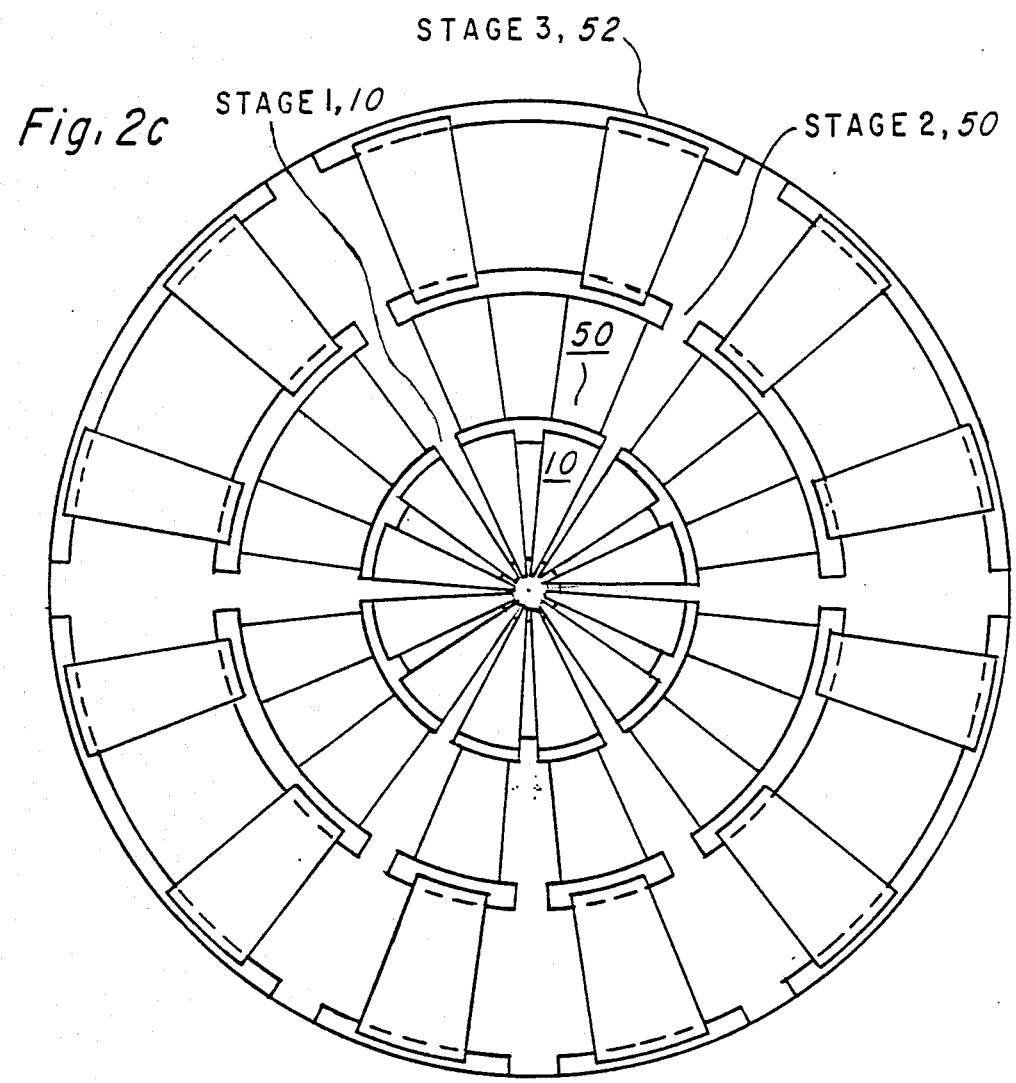
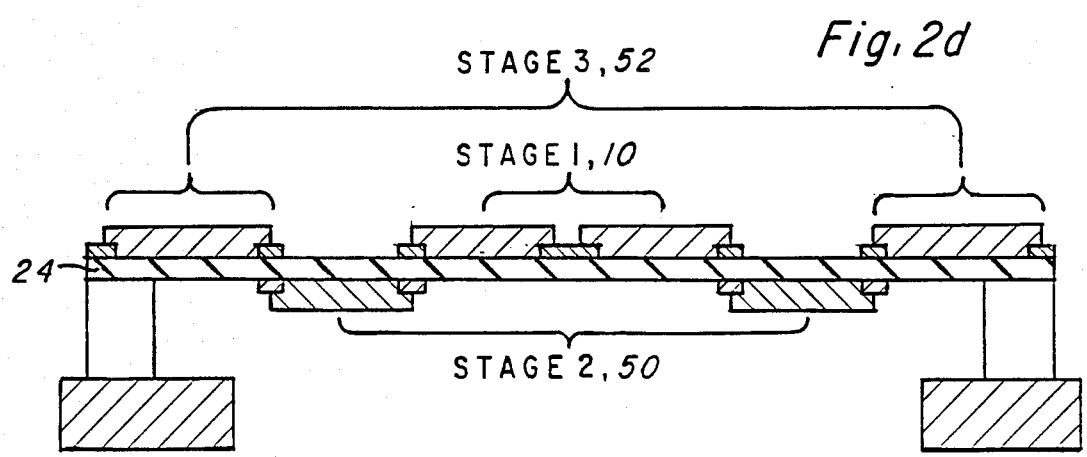

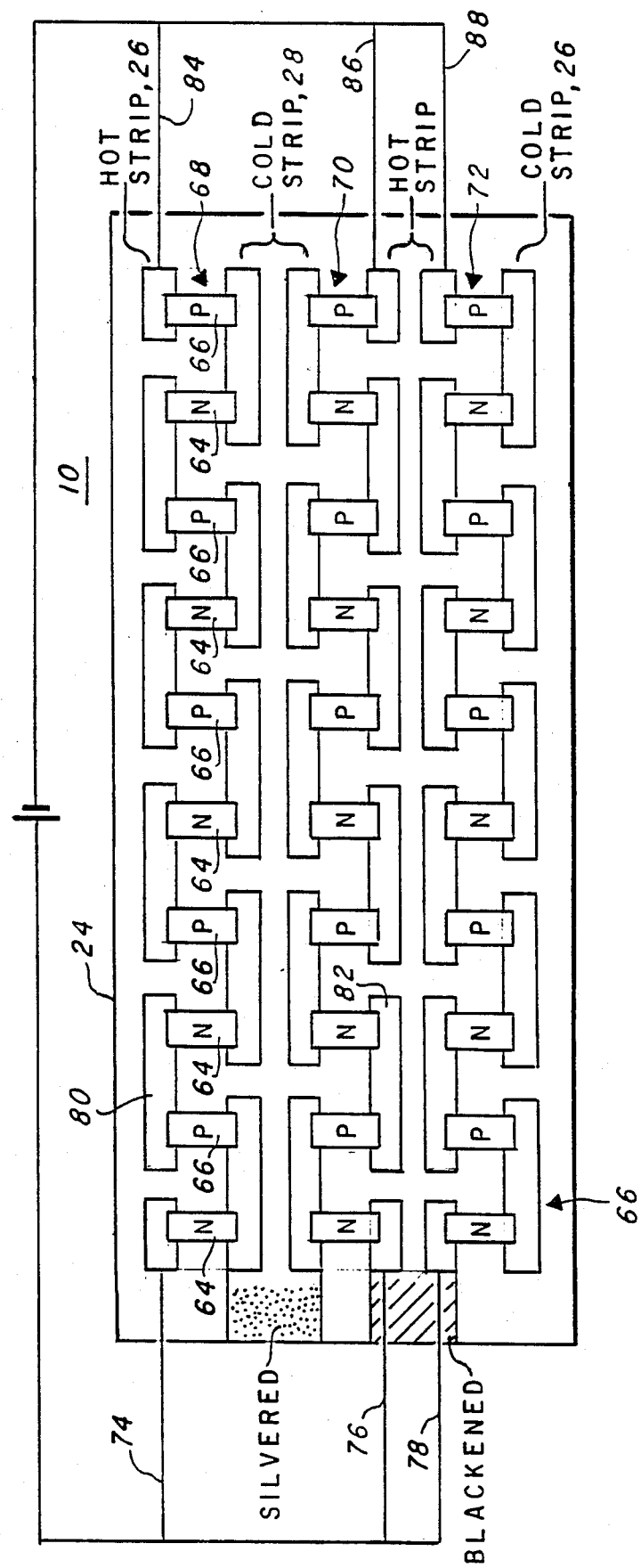

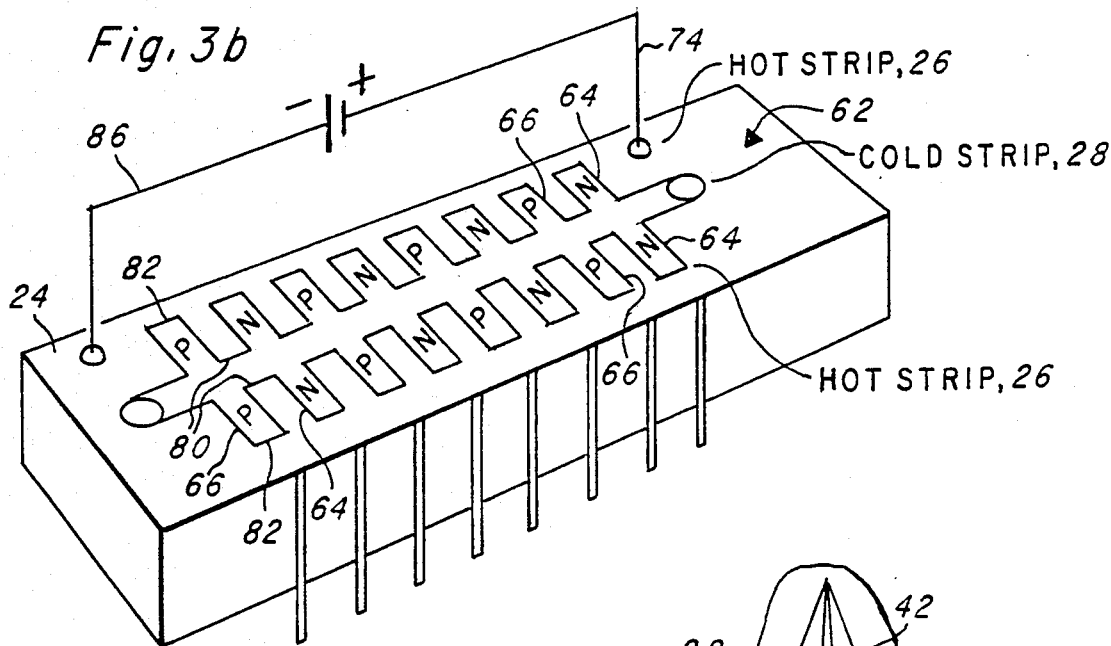
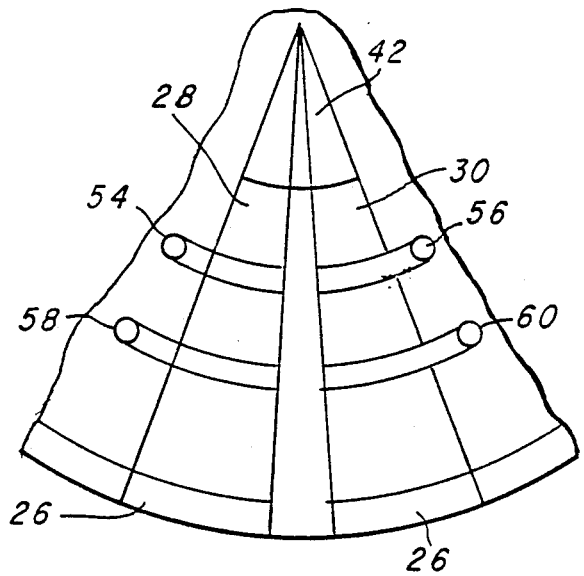
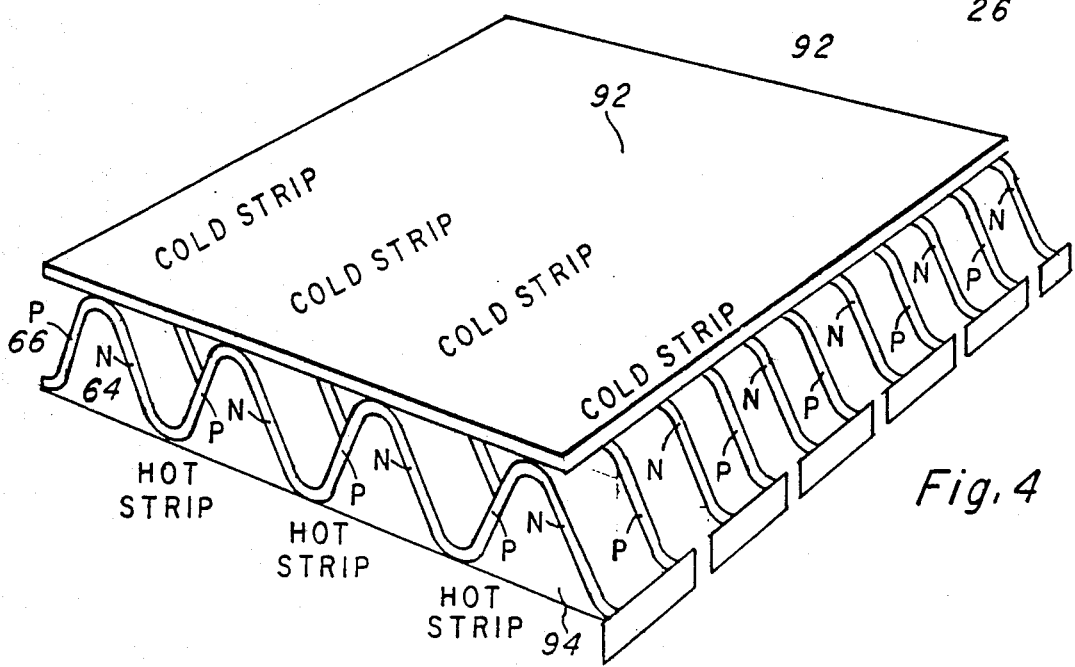

THERMOELECTRIC PILLOW AND BLANKET

This is a continuation of application Ser. No. 784,189, filed Oct. 4,1985 now abandoned.

This invention relates to thermoelectric devices and more particularly to a film type thermoelectric element for a thermoelectric heat pump or power source.

BACKGROUND OF THE INVENTION

In the past thermoelectric devices have included thermopiles made up of thermoelectric couples (thermocouple). Each thermocouple consists of a bar of P-type semiconductor material and a bar of N-type semiconductor material. An electrode connects one end of the P-type bar and one end of the N-type bar. The N-type bar of one thermocouple is connected to the P-type bar of the next thermocouple to form the thermopile.

The disadvantages of using bars of P-type and N-type semiconductors as the elements of the thermocouple are as follows:

(1) the bars are sawed from plates and a substantial amount of the material is lost in the form of saw dust; (2) the bars are brittle and fragile and thus their use is restricted to nonflexible type thermocouples; and (3) although the bars may be considered small in size, they cannot be made small enough for use in connection with all applications presently available in the market-place.

SUMMARY OF THE INVENTION

Accordingly it is an object this invention to provide a thermoelectric heat pump or power source device which is economical to fabricate.

Another object of the invention is to provide a thermoelectric heat pump or power source device which is flexible.

Still another object of the invention is to provide a planar thermoelectric heat pump/power source device.

Briefly stated the thermoelectric heat pump/power source device constituting the subject matter of this invention comprises P-type and N-type semiconductor film type conductive elements selectively patterned on substrates of either rigid or flexible electrically insulating material and electrically connected to provide either a thermoelectric heat pump for cooling hot spot forming devices, or a linear array of hot spot forming devices, or an electrical power source device. The electrical power source device utilizes heat generated by, for example, a hot pipe, a resistive element or the sun.

BRIEF DESCRIPTION OF THE DRAWINGS

The novel features characteristic of the embodiments of the invention may best be understood by reference to the following detailed description when read in conjunction with the accompanying drawings, wherein:

FIGS. 2a, 2b, 2c, 2d and 2e are schematic views, partly in block diagram, of a first embodiment of the invention and various arrangements thereof;

FIGS. 3a and 3b are schematic views, partly in block diagram, showing a second embodiment of the invention and arrangements thereof; and FIG. 4 is a schematic view, partly in block form, showing a third embodiment of the invention.

DETAILED DESCRIPTION OF THE PREFERRED EMBODIMENT

Figure 1A:
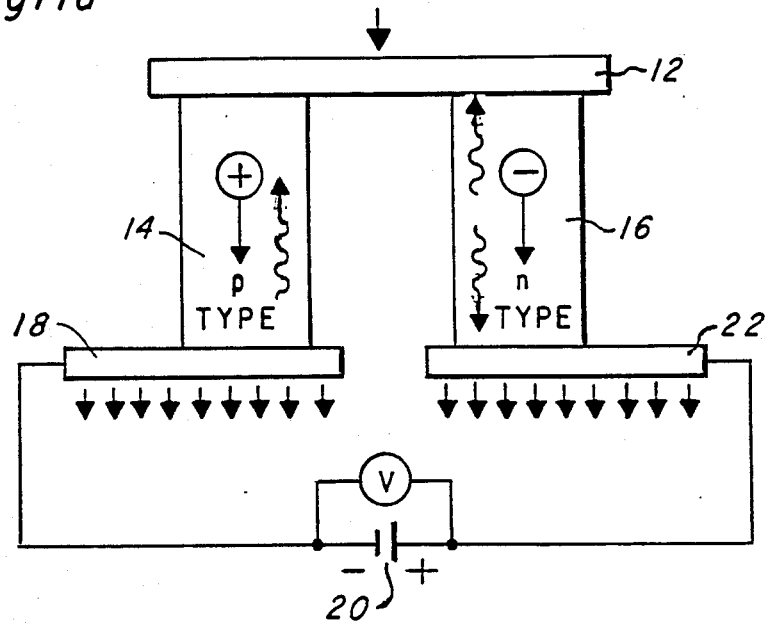
FIGS. 1a and 1b are sectional views of thermoelectric heat pumps utilizing bar type N-type and P-type semiconductor material operating, respectively, in the cooling and heating modes.

Referring now to FIG. 1a, a thermoelectric heat pump (TEHP) 10 consisting of an N-type and P-type semiconductor material in bar form is disclosed which operates in the cooling mode. The TEHP comprises a cold plate electrode 12 interconnecting electrically first ends of the P-type semiconductor material bar 14 and N-type semiconductor material bar 16. The P-type bar 14 has its second end electrically connected to an electrode 18. The electrode 18 is connected to the negative terminal of a dc source of power 20. Whilst, the N-type bar 16 has its second end connected to electrode 22. The electrode 22 is connected to the positive terminal of the dc source of power. A heat sink not shown is connected to electrodes 18 and 22.

In the heating mode (FIG. 1b) the polarity of the dc power source to the electrodes 18 and 22 is reversed.

In operation in the cooling mode a device being cooled is in thermal contact with the cold plate 12 and with the dc power applied, the temperature of the interconnecting cold plate electrode 12 decreases and heat is absorbed from the surroundings. Cooling occurs because electrons pass from a low energy level in the P-type material through the electrode 12 to a higher energy level in the N-type material. This heat is conducted through the semiconductor materials by electron transport to the other end of the junction at electrode 22 and liberated as the electrons return to a lower energy level in the P-type material. The product of the thermoelectric power and the absolute temperature of the cooling electrode 12 is the Peltier Coefficient.

Figure 1B:
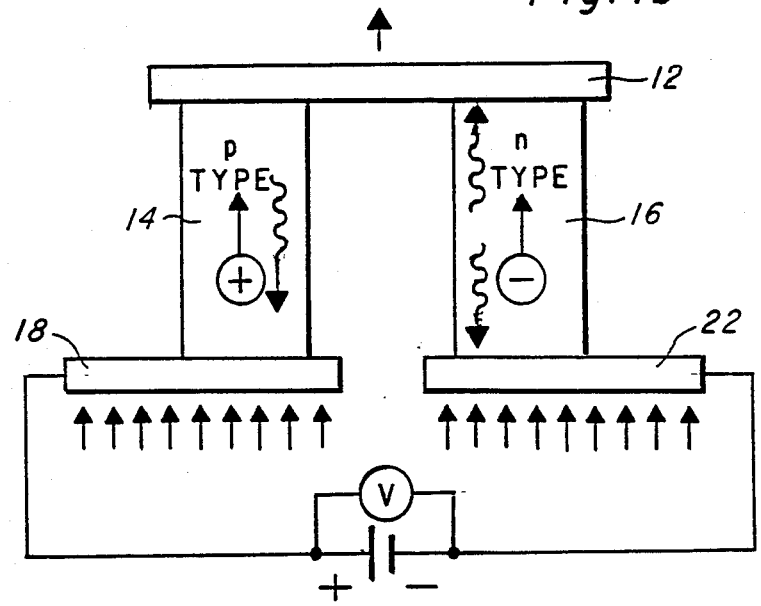

The Peltier Coefficient relates to a cooling effect as current passes from the N-type material to the P-type material. Thus as shown in FIG. 1b when the polarity of the dc source is reversed the Peltier Coefficient relates to a heating effect at electrode 12 when the current passes from the P-type material to an N-type material.

Applicants have found that the cooling effect (heat pumped) increases for a given voltage to a maximum if the temperatures at the cooling electrode 12 is kept substantially equal to that of the heat electrode 22 by heat dissipation through the heat sink. Thus, if it is desired to keep a device, such as, for example, a semiconductor very large scale integrated circuit device operating at ambient temperature it is necessary to pump by means of current flow the heat generated by the semiconductor device to a heat sink for dissipation into the outside environment.

Figure 2A:
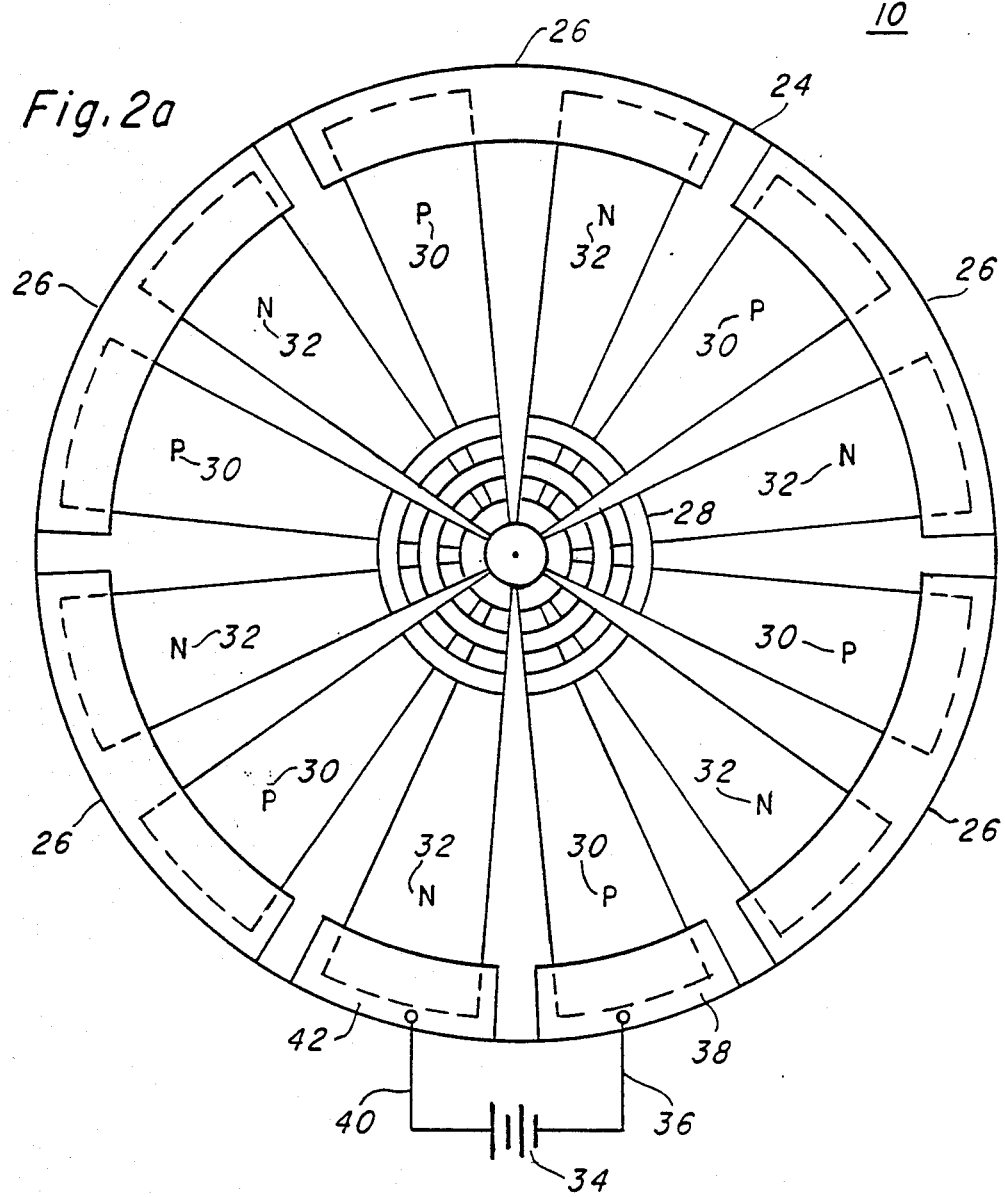

Referring now to FIG. 2a, a thermoelectric heat pump comprises a thin, thermally anisotropic substrate 24. The substrate may be, for example, a rigid semiconductor material such as, for example, alumina, or beryllia, or a ceramic mount or a flexible mount such as, for example, a plastic mount formed of a plastic sold under the trademark MYLAR or TEFLON by E. I. DuPont d'Nemours & Company.

A first metallized pattern 26 is deposited on the substrate 24 in a spaced relationship to a second or centrally disposed metallized pattern 28. The metallized patterns 26 and 28 are formed of a suitable conductive material such as, for example, gold, aluminum or copper which is sputtered or evaporated on the substrate and selectively removed by a photolithographic process using photoresist material.

After the first and second conductive patterns are formed, channels 30 and 32 are formed between the first and second metallization, using, for example, the photolithographic process, for alternative P-type and N-type regions of semiconductor materials such as, for example, N-type and P-type $Bi_2Te_3$ (Bismuth Telluride). The N-type and P-type $Bi_2Te_3$ channels are formed, for example, by a sputtering or an evaporating or a rubbing technique to form thin films; the channels may also be formed by silk screen techniques to form thick film structures. Applicants have found that a stick of P-type and N-type $Bi_xSb_ySe_zTe_t$ material may be rubbed onto the substrate to form substantially permanent film structures.

A P-type channel 30 and an N-type channel 32 form a thermocouple when first ends are connected by the first metallization pattern 26 and the second (opposing) end of a P-type channel of one thermocouple connected by the second metallization pattern 28 to the second end of an N-type channel of an adjacent As shown in FIG. 2a, the P-type and N-type semiconductor material films (hereafter "P-type" and/or "N-type" elements) are pie shaped (circle sectors) repeated to form a circle which are connected as described above to form a plurality of thermocouples for a thermopile (TEHP) 10 as follows:

A source of power 34 has its negative terminal connected by lead 36 to an P-type element contact 38 and its positive terminal connected by lead 40 to an N-type element contact 42. The ends of the P-type and N-type elements opposite contacts 38 and 42 are connected, respectively, by lead portions of the metallization 26 to the N-type element and P-type element of adjacent thermocouples. The adjacent and remaining thermocouples have their first ends similarly connected and their second ends operatively connected by leads of the first metallization pattern 26. Thus, in operation the second or centrally disposed second metallizations 28 form a cold core for a heat spot forming device and the first or outwardly disposed metallizations 26 form a hot annular ring.

Figure 2B:
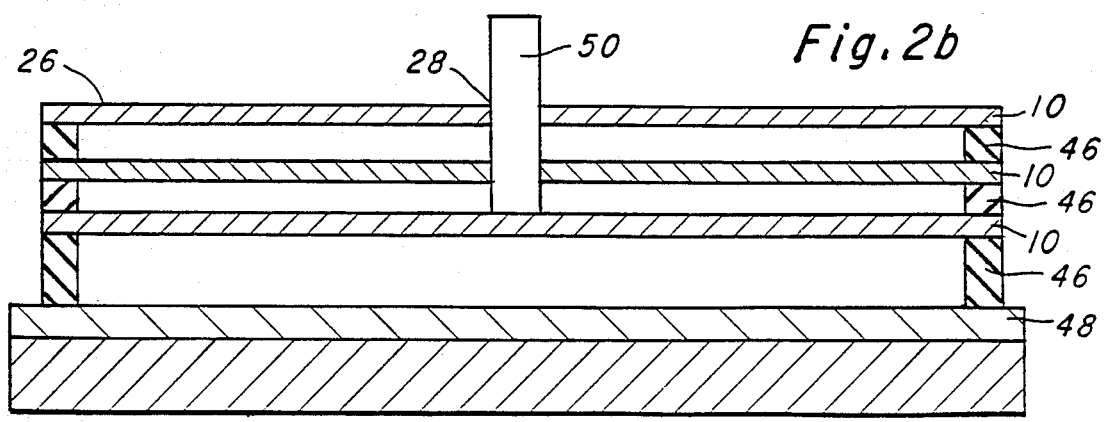

Referring now to FIG. 2b, a plurality of the thermoelectric heat pumps 10 (FIG. 2a) may be stacked (FIG. 2b) in spaced relationships by insulator type spacers 46 and mounted on a heat sink 48. Each thermoelectric heat pump 10 of the plurality of thermoelectric heat pumps has cold core walls forming apertures for a cold finger 49 upon which may be mounted a heat spot forming device for cooling.

Referring now to FIG. 2c, a plurality of thermoelectric heat pumps 10, 50 and 52 form concentric rings with the heat pump 10. The heat pumps 10, 50 and 52 are connected in cascade to form a multi-stage thermoelectric heat pump. The center section is that described and shown in connection with FIG. 2a. Each concentric ring thereafter is formed with its cold end surface adjacent to the hot end surface of an inner heat pump to form a multi-stage thermoelectric heat pump. A plurality of these multi-stage TEHPs may be stacked using the technique described in FIG. 2b.

It will be appreciated by those skilled in the art that for electrical isolation between the TEHP stages, the center stage is affixed to one side of the substrate 24 (FIG. 2d) with each succeeding outwardly disposed stage affixed to the surface of the substrate 24 opposite the substrate surface to which the preceding stage is affixed.

The cascade effect can also be achieved by progressively increasing the size of the P-type and N-type elements 28 and 30 of the thermocouples (FIG. 2e) from the cold core ends to the hot ring ends and affixing thereto spaced electrical conductors 54 and 56, and 58 and 60 at spaced intervals from the cold core 42 end to the hot core end 44 of the first thermocouple. Lead conductors 54 and 56 are connected to a dc power source at a first preselected potential and lead conductors 58 and 60 are connected to a dc power source at a second preselected potential sufficient to maintain current density throughout the increasing area of the P-type and N-type (circle sector) elements. By maintaining the current density throughout the increased area of the P-type and N-type elements the heat pumping capacity increases progressively from the cold core to the hot annular ring.

Referring now to FIG. 3a, a ladder shaped thermoelectric hear pump 10 comprises a substrate 24. Substrate 24 may be, for example, a Beryllia, an Alumina, a Ceramic, or a rigid plastic substrate or a surface of a semiconductor package such as, for example, a dual in-line package 62 (FIG. 3b). Columns of spaced N-type elements 64 are affixed to the substrate 24 (FIGS. 3a and 3b) and columns of spaced P-type thermoelectric elements 66 are affixed to the substrate 24 intermediate the columns of N-type elements to form rows 68, 70, 72 of alternatively spaced N-type and P-type elements. The odd rows 68 and 72 (FIG. 3a) of alternative N-type and P-type elements have first ends of the first column 66 of N-type thermoelectric elements 64 and the second row 70 of N-type and P-type elements have second ends of the first column of N-type thermoelectric elements connected by leads 74, 76, and 78 to the positive terminal of a dc power source. While the second ends of the odd rows 68 and 72 and the first ends of the even rows 70 are connected by leads 80 and 82 respectively, to the adjacent column of P-type elements 66. The electrical connections proceed in this alternative fashion to form a snake like electrical path to the end column of P-type thermoelectric elements 66. The leads 74, 76, and 78 and leads 84, 86, and 88 are connected, respectively, to the positive and negative connected terminals of the dc source of power. In this arrangement, the first ends and second ends of the thermoelectric elements of the odd rows form, respectively, hot and cold sides and the first ends and the second ends of the thermoelectric elements of the even rows 70 form, respectively, hot and cold sides corresponding to those of the odd rows.

To provide a dc power generating unit such as, a solar energy panel system the hot end conductors are blackened (FIG. 3a) and the cold end conductors are silvered to provide hot and cold strips which create a temperature difference established by the relative differences of energy absorption to produce dc power for charging a dc power source (shown as the battery).

Referring now to FIG. 3b, the dual in-line package 62 either forms the support for a pair of thermocouple arrays constructed as shown in FIG. 3a or provides the substrate for pairs of the thermoelectric elements electrically connected as shown in FIG. 3a. The pair of arrays are arranged with their cold strips centrally disposed adjacent to each other and their hot strips outwardly spaced therefrom. The first end and second end elements of the cold strips are connected, respectively, by leads 74 and 86 to the positive and negative terminals of a dc power source.

In a final embodiment (FIG. 4), a ladder configuration (FIG. 3a) is formed in which the substrate 24 is of a flexible plastic material such as MYLAR, KAPTON or TEFLON on which thermocouples of P-type and N-type thermoelectric film type elements are formed using, for example, the rubbing technique or other well known thin film semiconductor techniques and the interconnecting conductors are of, for example, gold aluminum or copper which may be sputtered thereon.

The flexible substrate and P-type and N-type thermoelectric elements are folded to combine all cold strips on a first plane and all hot strips on a second plane opposing the first plane of the cold strips. Plates 92 and 94 are affixed; respectively, to the cold and hot strips to form panels. The cold plate may be silvered and the hot plate blackened to provide a source of dc current which results from the difference in temperature.

Further, the space between the corrugations and plates may be filled with insulation material such as styrofoam to form corrugated panels or blankets which when powered by a dc source of power provides a hot surface and a cold surface.

It will be appreciated that these panels or blankets have numerous applications in, for example, therapy pads, refrigerators, helmets, temperature control chambers, plates, blankets and space suits.

It will be appreciated by those persons skilled in the art that various changes in the details, materials and arrangement of parts of the preferred embodiments of this invention can be made without departing from the scope o the invention.

What is claimed:

1. A thermoelectric device pillow comprising:
   (a) a substrate of corrugated material;
   (b) a plurality of n-type and p-type conductivity material elements formed in alternative columns beginning with a column of either n-type or p-type conductivity material elements and ending with a column of elements of opposite conductivity to that of the beginning column of elements and serially connected together to form p-n junctions, said columns being formed on opposing loops of the corrugated substrate;
   (c) conductive leads connected to the beginning column of elements and to the ending column of elements for connecting a dc source of power thereto for producing selectively opposing hot and cold sides of the corrugated substrate; and
   (d) a bag of thermal conductive material enclosing the corrugated substrate assembly for providing a pillow having a hot side and a cold side.

2. A thermoelectric blankercomprising:
   (a) a substrate of corrugated material;
   (b) a plurality of n-type and p-type conductivity material elements formed in alternative columns beginning with a column of either n-type or p-type conductivity material elements and ending with a column of elements of opposite conductivity to that of the beginning column of elements and serially connected together to form p-n junctions, said columns being formed on opposing loops of the corrugated substrate; and
   (c) conductive leads connected to the beginning column of elements and to the ending column of elements for connecting a dc source of power thereto for producing selectively opposing hot and cold sides of the corrugated substrate; and
   (d) layers of thermal conductive material enclosing the corrugated substrate assembly for providing a blanket having a hot side and a cold side.

* * * * *